United States Patent
Colgan et al.

(10) Patent No.: US 11,335,657 B2
(45) Date of Patent: May 17, 2022

(54) WAFER SCALE SUPERCOMPUTER

(71) Applicant: International Business Machines Corporation, Armonk, NY (US)

(72) Inventors: Evan Colgan, Montvale, NJ (US); Timothy J. Chainer, Putnam Valley, NY (US); Monty Montague Denneau, Putnam, NY (US); Kai Schleupen, Yorktown Heights, NY (US); Diego Anzola, Burlington, VT (US); Mark D. Schultz, Ossining, NY (US); Layne A. Berge, Rochester, NY (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 17/023,297

(22) Filed: Sep. 16, 2020

(65) Prior Publication Data
US 2022/0084969 A1    Mar. 17, 2022

(51) Int. Cl.
*H01L 23/00*    (2006.01)
*H01L 25/065*    (2006.01)
(Continued)

(52) U.S. Cl.
CPC ............ *H01L 24/08* (2013.01); *H01L 23/481* (2013.01); *H01L 23/544* (2013.01);
(Continued)

(58) Field of Classification Search
CPC ..... H01L 24/08; H01L 23/481; H01L 23/544; H01L 23/562; H01L 25/0657;
(Continued)

(56) References Cited

U.S. PATENT DOCUMENTS 7,851,348 B2 * 12/2010 Misra ................ H01L 21/76898
                                                              438/618
9,082,808 B2 *  7/2015 Thacker ............... H01L 25/0652
(Continued)

FOREIGN PATENT DOCUMENTS

| CN | 109448370 A | 3/2019 |
|----|-------------|--------|
| CN | 109558370 A | 4/2019 |
| WO | WO2019060798 A1 | 3/2019 |

OTHER PUBLICATIONS

Moore, "GlobalFoundries, Arm Close in on 3D Chip Integration," IEEE Spectrum, https://spectrum.ieee.org/tech-talk/semiconductors/processors/globalfoundries-arm-close-in-on-3d-chip-integration, Aug. 2019, pp. 1-3.
(Continued)

*Primary Examiner* — Mamadou L Diallo
(74) *Attorney, Agent, or Firm* — Daniel Morris; Otterstedt, Wallace & Kammer, LLP

(57) ABSTRACT

A data processing system includes a first wafer comprising a plurality of first chips, and kerf and crack-stop structures around perimeters of the first chips, and a second wafer comprising a plurality second chips, a plurality of interconnect structures through a connection zone between the second chips, and a plurality of thru silicon vias, wherein the first wafer and the second wafer are bonded face-to-face such that the interconnect structures of the second wafer electrically connect adjacent chip sites of the first wafer and where a pitch of the chips on the first and second wafer are equal.

20 Claims, 12 Drawing Sheets

(51) Int. Cl.
    *H01L 23/48*     (2006.01)
    *H01L 23/544*     (2006.01)

(52) U.S. Cl.
    CPC ........ *H01L 23/562* (2013.01); *H01L 25/0657* (2013.01); *H01L 2223/5446* (2013.01); *H01L 2224/08145* (2013.01); *H01L 2225/06541* (2013.01)

(58) Field of Classification Search
    CPC ... H01L 2223/5446; H01L 2224/08145; H01L 2225/06541
    See application file for complete search history.

(56) References Cited

U.S. PATENT DOCUMENTS

| | | | |
|---|---|---|---|
| 9,568,960 | B2 | 2/2017 | Colgan et al. |
| 9,589,895 | B2 | 3/2017 | Bazan et al. |
| 9,666,677 | B1* | 5/2017 | Raring ................ H01L 27/0676 |
| 10,002,900 | B2 | 6/2018 | Kumar et al. |
| 10,423,877 | B2 | 9/2019 | Cox et al. |
| 2008/0124835 | A1* | 5/2008 | Chen ....................... H01L 25/50 438/107 |
| 2011/0133339 | A1* | 6/2011 | Wang ................ H01L 21/76898 257/773 |
| 2012/0018832 | A1* | 1/2012 | Cooney, III ............ G06F 30/30 257/432 |
| 2012/0080673 | A1* | 4/2012 | Winter .................. H01L 23/585 257/48 |
| 2015/0325531 | A1* | 11/2015 | Dyer ....................... H01L 23/58 257/620 |
| 2016/0260674 | A1* | 9/2016 | Jones ................ H01L 21/76898 |
| 2018/0096973 | A1* | 4/2018 | Shen ....................... H01L 24/83 |
| 2019/0115314 | A1* | 4/2019 | Liu ......................... H01L 24/83 |
| 2019/0221558 | A1* | 7/2019 | Chen ....................... H01L 24/16 |
| 2019/0279938 | A1 | 9/2019 | Mehta et al. |
| 2019/0355706 | A1* | 11/2019 | Enquist .................. H01L 24/92 |
| 2021/0098635 | A1* | 4/2021 | Jacobs ................... H01L 31/18 |
| 2021/0104495 | A1* | 4/2021 | Vodrahalli .......... H01L 25/0652 |
| 2021/0225708 | A1* | 7/2021 | Lee ......................... H01L 21/78 |
| 2021/0249380 | A1* | 8/2021 | Chen ....................... H01L 25/50 |
| 2021/0292160 | A1* | 9/2021 | Heuck ................. B81C 1/00238 |
| 2021/0375819 | A1* | 12/2021 | Chen ....................... H01L 24/80 |

OTHER PUBLICATIONS

Lapedus, "The Race To Next-Gen 2.5D/3D Packages," Semiconductor Engineering, https://semiengineering.com/the-race-to-next-gen-2-5d-3d-packages, Sep. 2019, pp. 1-19.

* cited by examiner

US 11,335,657 B2

WAFER SCALE SUPERCOMPUTER

STATEMENT REGARDING FEDERALLY SPONSORED RESEARCH OR DEVELOPMENT

This invention was made with Government support under Contract No.: H98230-13-D0122/0005 awarded by Maryland Procurement Office. The Government has certain rights in this invention.

BACKGROUND

The present invention relates to semiconductor devices and more particularly to a method for building a wafer-scale computing device using face-to-face wafer bonding.

On typical high performance semiconductor device wafers the "kerf" region contains test sites, alignment marks, process monitoring structures, etc. When the individual chips are diced from the wafer, prior to packaging, a diamond saw is used to cut along the kerf channels between the chips. The perimeter of each chip (or chip site, die, die site, etc.) on a wafer contains a "crack-stop" structure composed of stacked metal layers, both lines and vias, which acts as a moisture barrier and prevents cracks between the dielectric layers introduced by dicing from migrating into the active chip area.

To wire between adjacent chips by "stitching" with existing metal layers to create a wafer-scale computing device, it is necessary to move kerf structures and remove portions of the crack-stop to allow wiring between adjacent chip sites, which will reduce the effectiveness of the moisture barrier.

One means of alleviating this problem, is to introduce an edge seal moisture barrier around the perimeter of a wafer as described in U.S. Pat. No. 9,589,895. This can be effective for wafer-scale computing devices since the individual chips will not be diced out, but it requires a number of modifications to be made to a standard high performance semiconductor manufacturing process, and in particular for the latest semiconductor node which offers the best performance.

One technical challenge in wafer-scale computing devices is maintaining adequate supply voltage levels when large power transients occur from multiple parallel computing or storage units turning on or off simultaneously. In typical chip packaging, the semiconductor chip is mounted on a laminate substrate that is larger in area than the chip, which provides additional space for attaching capacitors on either the laminate substrate beside the chip, or on the back side of the laminate substrate opposite the chip. With wafer scale packaging, for example, as described in U.S. Pat. No. 9,568,960, the laminate substrate is smaller than the individual chip areas and the space available for adding capacitors is limited. Some semiconductor technologies, generally not that of the most recent node with the smallest features, but prior generation process nodes, implement additional features such as deep trench (DT) capacitors and thru-silicon vias (TSVs).

BRIEF SUMMARY

According to an embodiment of the present invention, a data processing system comprises a first wafer comprising a plurality of first chips, and kerf and crack-stop structures around perimeters of the first chips, and a second wafer comprising a plurality second chips, a plurality of interconnect structures through a connection zone between the second chips, and a plurality of thru silicon vias, wherein the first wafer and the second wafer are bonded face-to-face such that the interconnect structures of the second wafer electrically connect adjacent chip sites of the first wafer and where a pitch of the chips on the first and second wafer are equal.

According to an embodiment of the present invention, a computer system includes a first wafer comprising a plurality of wafer-to-wafer interconnect structures terminated on a first insulator surface layer of the first wafer, and a second wafer comprising a plurality of chip-to-chip interconnects disposed through a connection zone and terminated on a second insulator surface layer of the second wafer, and a plurality of thru silicon vias, wherein the first wafer and the second wafer are bonded face-to-face such that the chip-to-chip interconnects of the second wafer are electrically connected to the wafer-to-wafer interconnect structures of the first wafer, and the chip-to-chip interconnects and the wafer-to-wafer interconnect structures electrically connect a plurality of chip sites of the first wafer and the second wafer, and wherein the first wafer comprises kerf and crack-stop structures around perimeters of the chip sites of the first wafer in the connection zone.

According to an embodiment of the present invention, a data processing system comprising a first substrate comprising a plurality of first chips and comprising a plurality of wafer-to-wafer interconnect structures through a connection zone and terminated on a first insulator surface layer, and a second substrate comprising a plurality of second chips and comprising a plurality of chip-to-chip interconnects terminated on a second insulator surface layer, and a plurality of thru silicon vias, wherein the first substrate and the second substrate are bonded face-to-face such that the chip-to-chip interconnects of the second substrate are electrically connected to the wafer-to-wafer interconnect structures of the first substrate, and the wafer-to-wafer interconnect structures electrically connect opposing ones of the chips of the first and the second substrates, wherein the first substrate comprises kerfs disposed with correspondence around the chip-to-chip interconnects of the seconds chips, wherein the first substrate comprises crack-stop structures disposed within perimeters of the first chips, and wherein the second substrate comprises kerf and crack-stop structures disposed around the perimeters of the second chips in the connection zone.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments may provide for:

a wafer scale computer system including two wafers bonded face-to-face where one wafer provides the die-to-die interconnects for the other wafer;

a structure for a data processing system comprising two wafers bonded face-to-face, where a bottom wafer contains kerf and crack-stop structures around die perimeters and a top wafer provides interconnects between die sites on the bottom wafer; and a structure for a data processing system comprising two substantially equal sized pieces of silicon bonded face-to-face, where a bottom wafer contains two or more die sites with kerf and crack-stop structures around die perimeters and a top piece of silicon provides interconnects between die sites on the bottom wafer.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

Preferred embodiments of the present invention will be described below in more detail, with reference to the accompanying drawings.

DETAILED DESCRIPTION

Embodiments of the present invention include a bonded wafer scale computing device formed by face-to-face bonding of two wafers. A first wafer, often the compute wafer, can be fabricated with the latest technology node, implementing conventional kerf and crack-stop structures around the chip site perimeters. A second wafer, the interconnect wafer, provides the die-to-die communications for the other wafer. According to some embodiments, the interconnect wafer can be fabricated with a prior generation technology node and providing interconnects facilitating connections to adjacent die sites on the compute wafer. According to one or more embodiments, the interconnect wafer includes (optionally) router logic, power conversion devices, memory devices, or decoupling capacitors. The interconnect wafer can further comprise an edge seal moisture barrier around the perimeter of a wafer. According to some embodiments, a crack stop may be omitted when the wafers are not diced or cut. The first and second wafers can be joined by a number of different means, for example, by copper-to-copper (Cu/Cu) and oxide/oxide hybrid bonding (e.g., stack and connect dies directly using a Cu/Cu diffusion bonding technique, eliminating the need for bumps and pillars).

Figure 1:
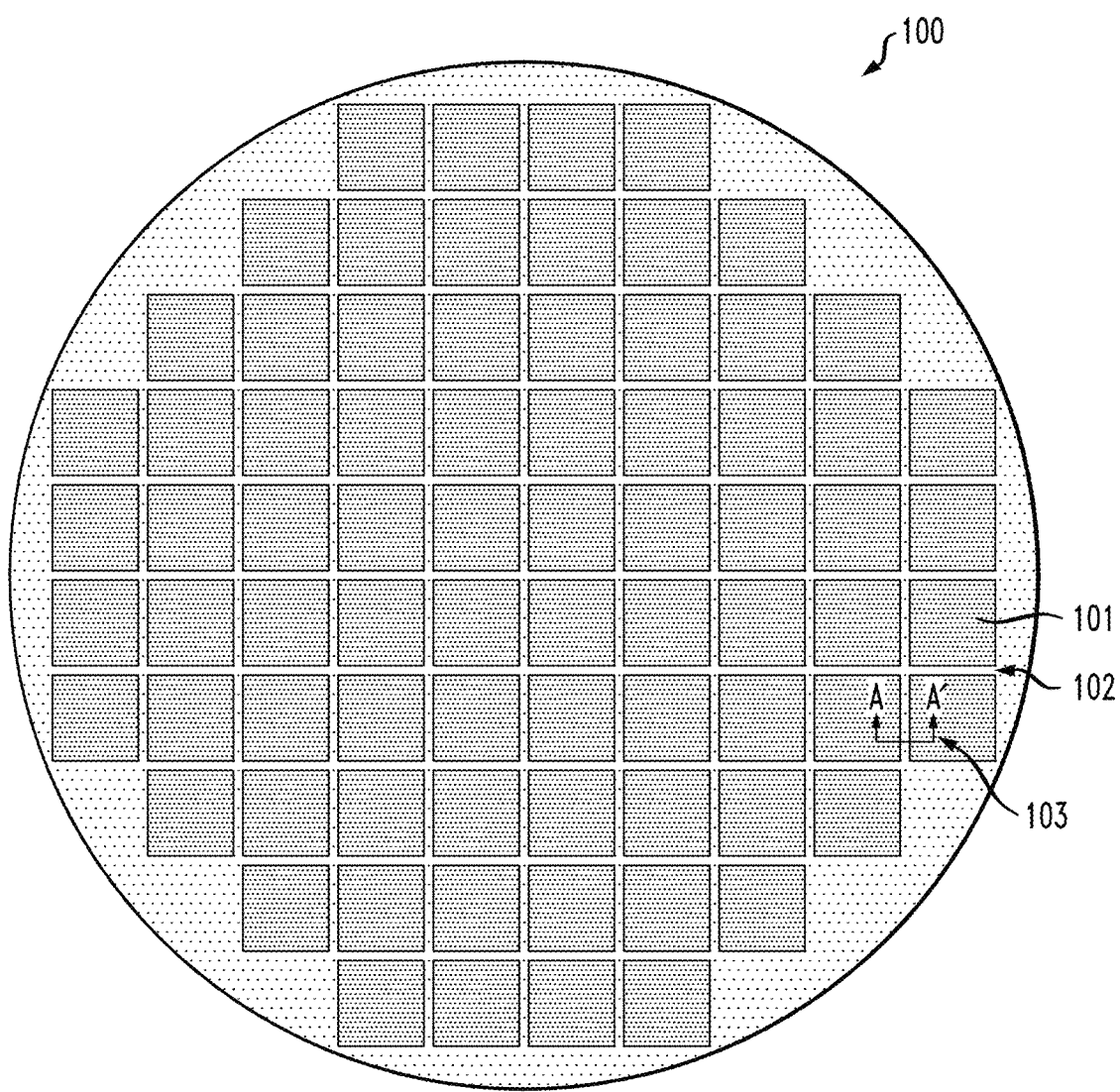
FIG. 1 shows a semiconductor device wafer comprising a plurality of chips according separated by kerf channels.
Figure 2:
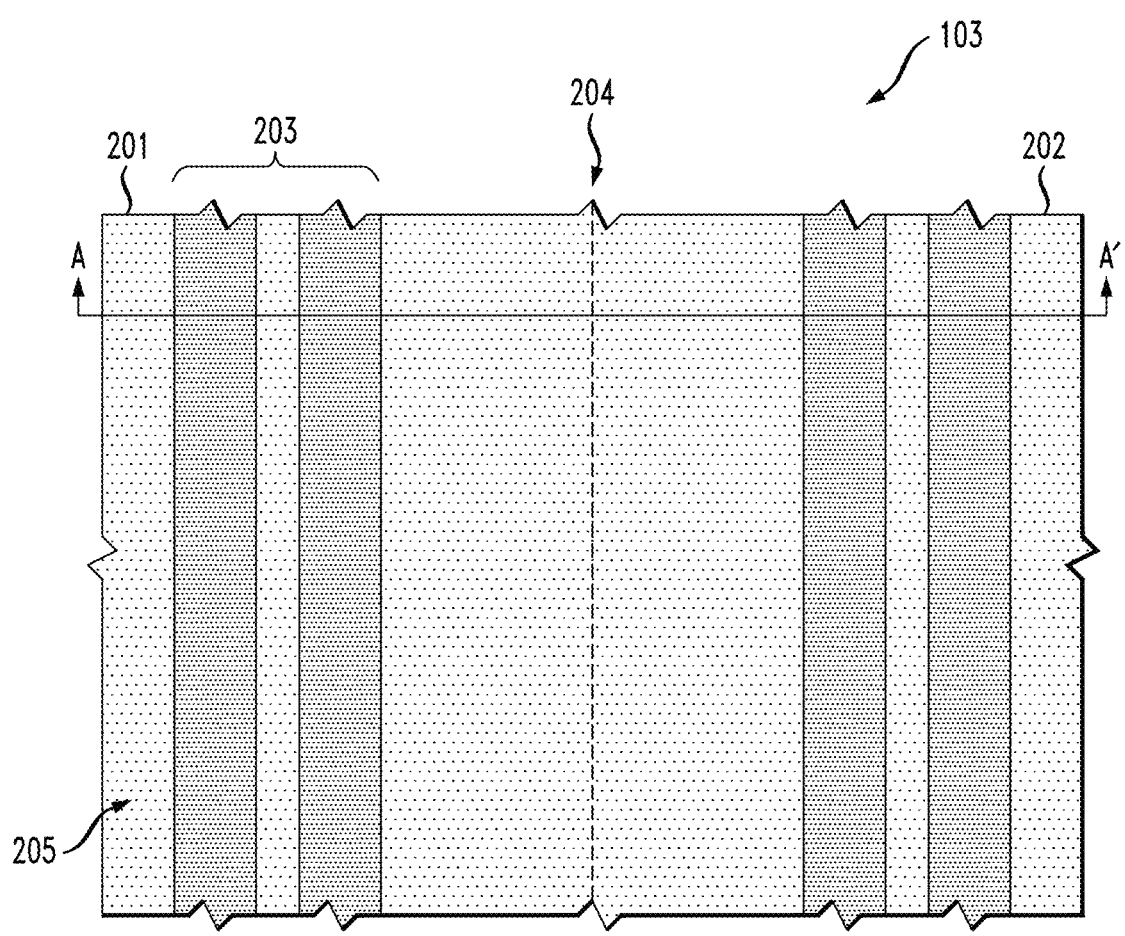
FIG. 2 shows a region between chips on a wafer.

FIG. 1 shows a semiconductor device wafer 100 comprising a plurality of chips (or die), e.g., 101, the kerf region, e.g., 102, between the chips. Region 103 is depicted in FIG. 2. At region 103 a boundary between a first chip 201 and a second chip 202 is shown. Each chip of wafer 100 includes a crack-stop, e.g., 203, separating a dicing kerf 204 from an active chip area 205.

According to some embodiments, a face-to-face wafer bonding with fine pitch, for example, from about 0.25 to 25 microns, vertical interconnects between the wafers uses oxide/oxide and Cu/Cu bonding.

Figure 3:
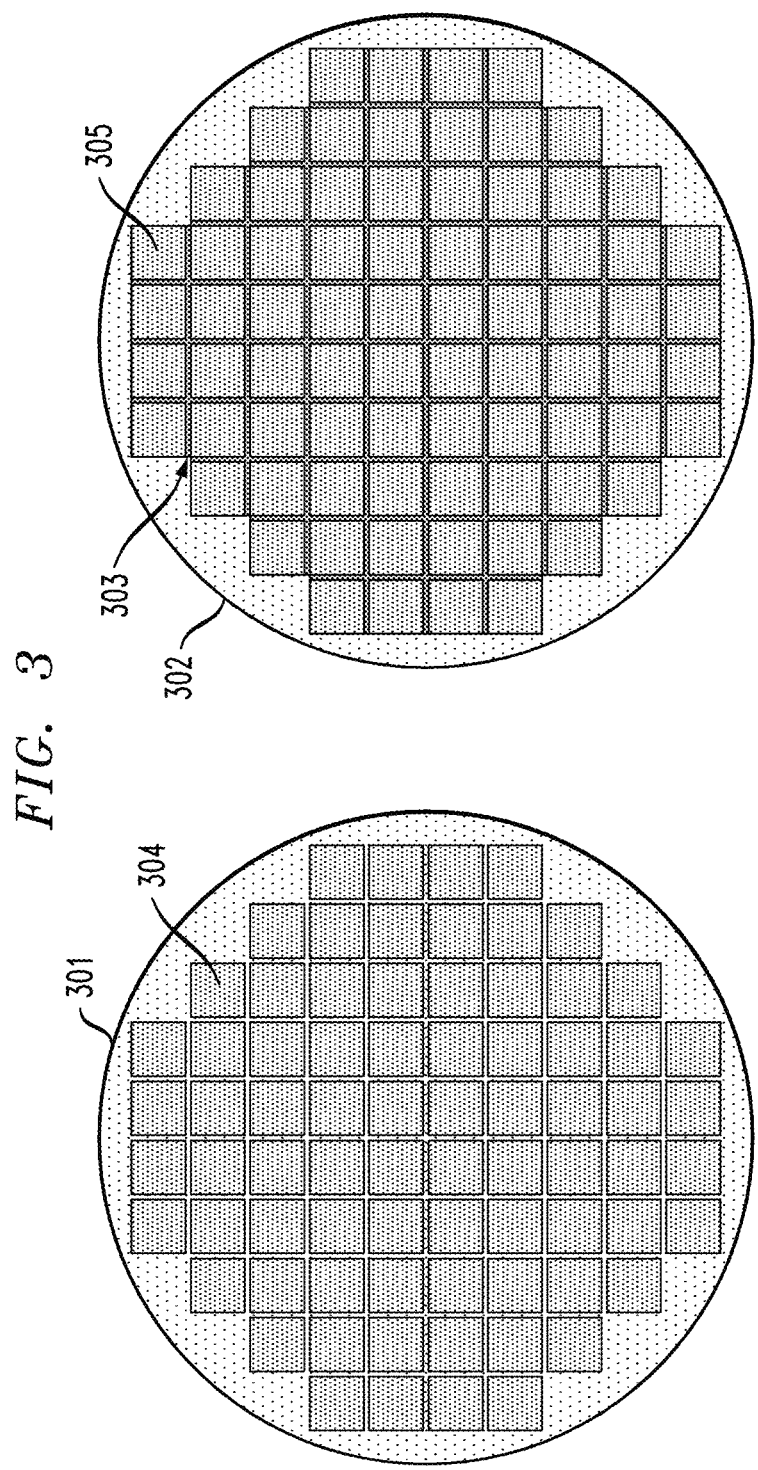
FIG. 3 shows first and second semiconductor device wafers according to one or more embodiments of the present invention.
Figure 4:
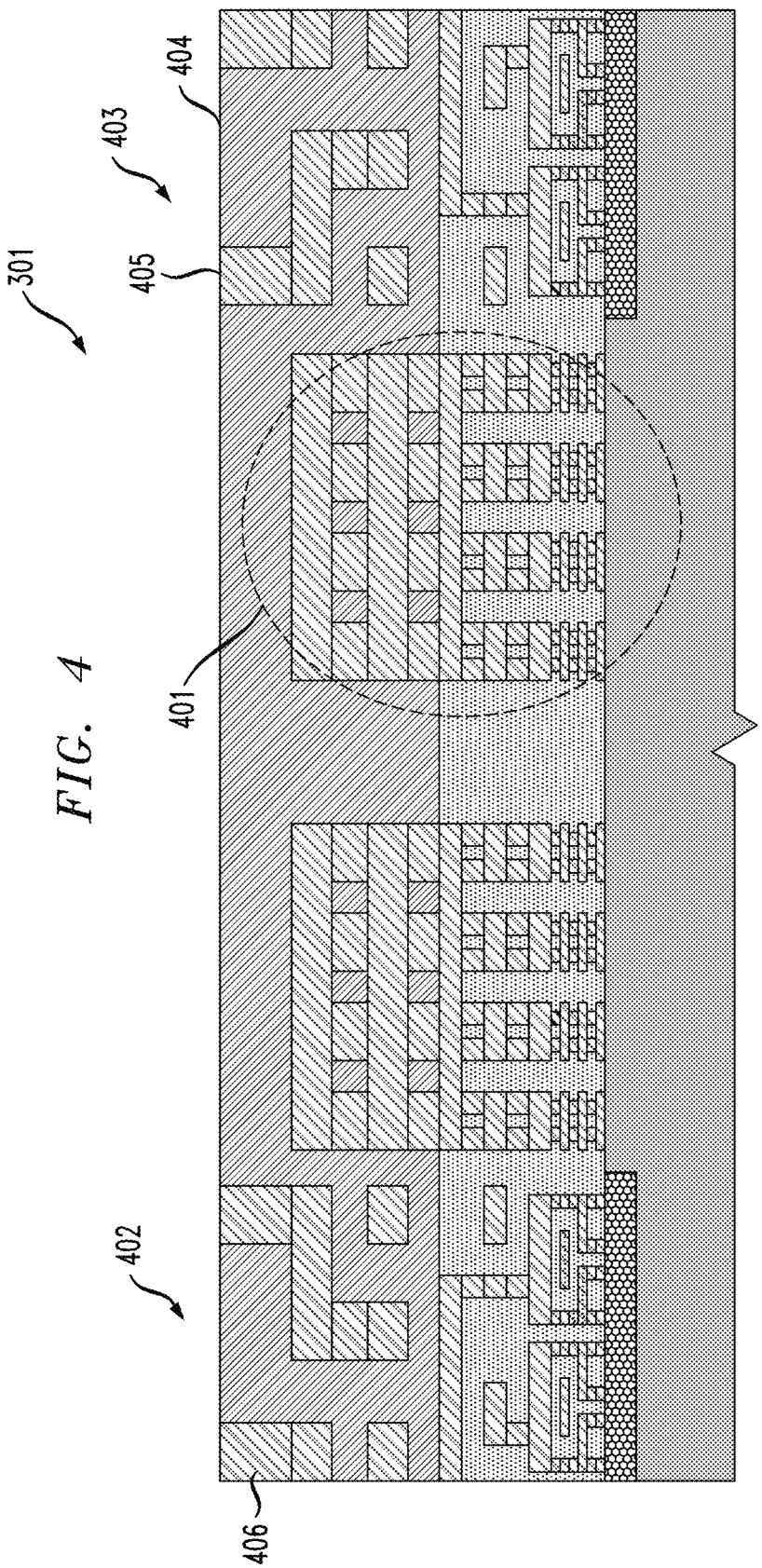
FIG. 4 shows a cross-section of the first wafer of FIG. 3.
Figure 5:
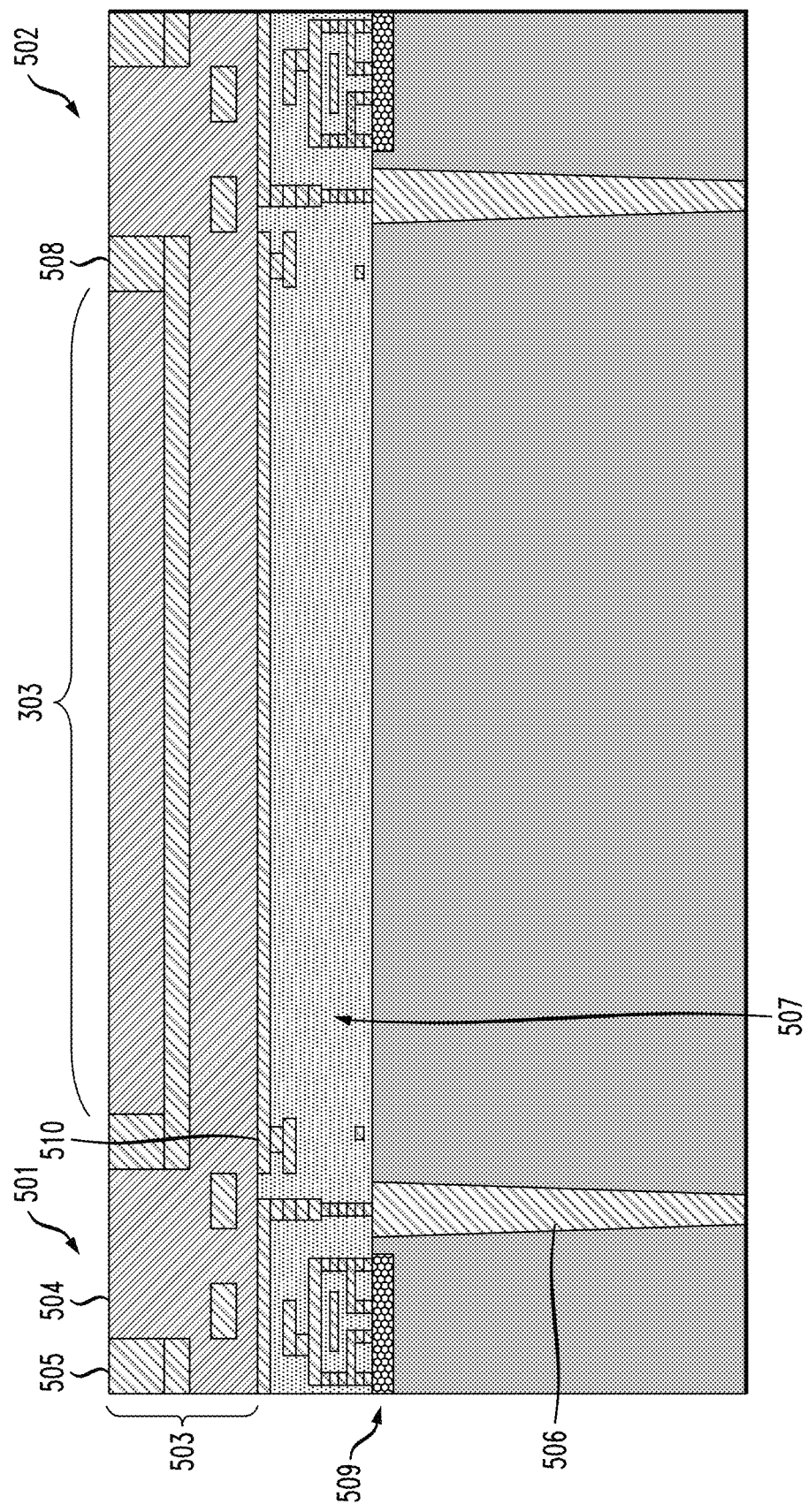
FIG. 5 shows a cross-section of the second wafer of FIG. 3.

FIG. 3 shows a planar view of a first wafer 301 (see also FIG. 4) and a second wafer 302 (see also FIG. 5) configured for face-to-face bonding according to at least one embodiment of the present invention. According to some embodiments, the pitch (spacing between the centers in the horizontal and vertical direction) of the chips (e.g., 304) of the first wafer 301 is equal to the pitch of chips (e.g., 305) of the second wafer 302, hence the chip sizes are equal and the arrangement of chip sites on the first wafer 301 is a mirror image of the arrangement of chip sites on the second wafer 302. According to some embodiments, in a wafer scale supercomputer including two wafers (301-302) bonded face-to-face (see also FIG. 6), the first wafer 301 includes conventional kerf and crack-stop structures. For example, see FIG. 4, where two crack-stop and moisture barrier structures (e.g., 401) are disposed between chip active areas 402-403. The kerf area, which in this case is empty, is the region directly between the crack-stops.

According to some embodiments, the first wafer 301 is a bottom wafer including current/advanced generation process nodes or chips 304. A top level of the first wafer 301 is configured for wafer-to-wafer bonding to the second wafer 302, where contacts for wafer-to-wafer interconnects 405 are arranged around the perimeter of each chip and aligned with the periphery of active chips areas 402-403.

According to some embodiments, the first wafer 301 comprises a conventional crack-stop 401 and kerf area, and the wafer-to-wafer interconnects 405 (e.g., Cu vias) terminated on an oxide insulator 404. According to some embodiments, additional Cu vias such as 406 are present throughout the active chip areas 402-403, and are configured to receive power from the second wafer 302 and external or internal I/O connections, for example, for accessing memory or other resources on the corresponding chip areas of the second wafer. It should be understood for purposes of the present description that the active area includes an area within the crack-stop, as wafer-to-wafer interconnects are provided across the whole active area for power delivery and access to memory or other resources provided by a bonded device and for external I/O connections off the wafers by way of the thru silicon via's (e.g., see 506, FIG. 5 and FIG. 6).

According to one or more embodiments, the second wafer 302 includes, for example, features such as thru silicon via's (TSVs) (506), deep trench (DT) capacitors (509), wiring levels, etc. According to some embodiments, the second wafer 302 is a top wafer utilizing prior generation process nodes or chips 305.

According to some embodiments, the second wafer 302 includes a wafer edge seal as described in U.S. Pat. No. 9,589,895 to provide moisture protection.

Figure 6:
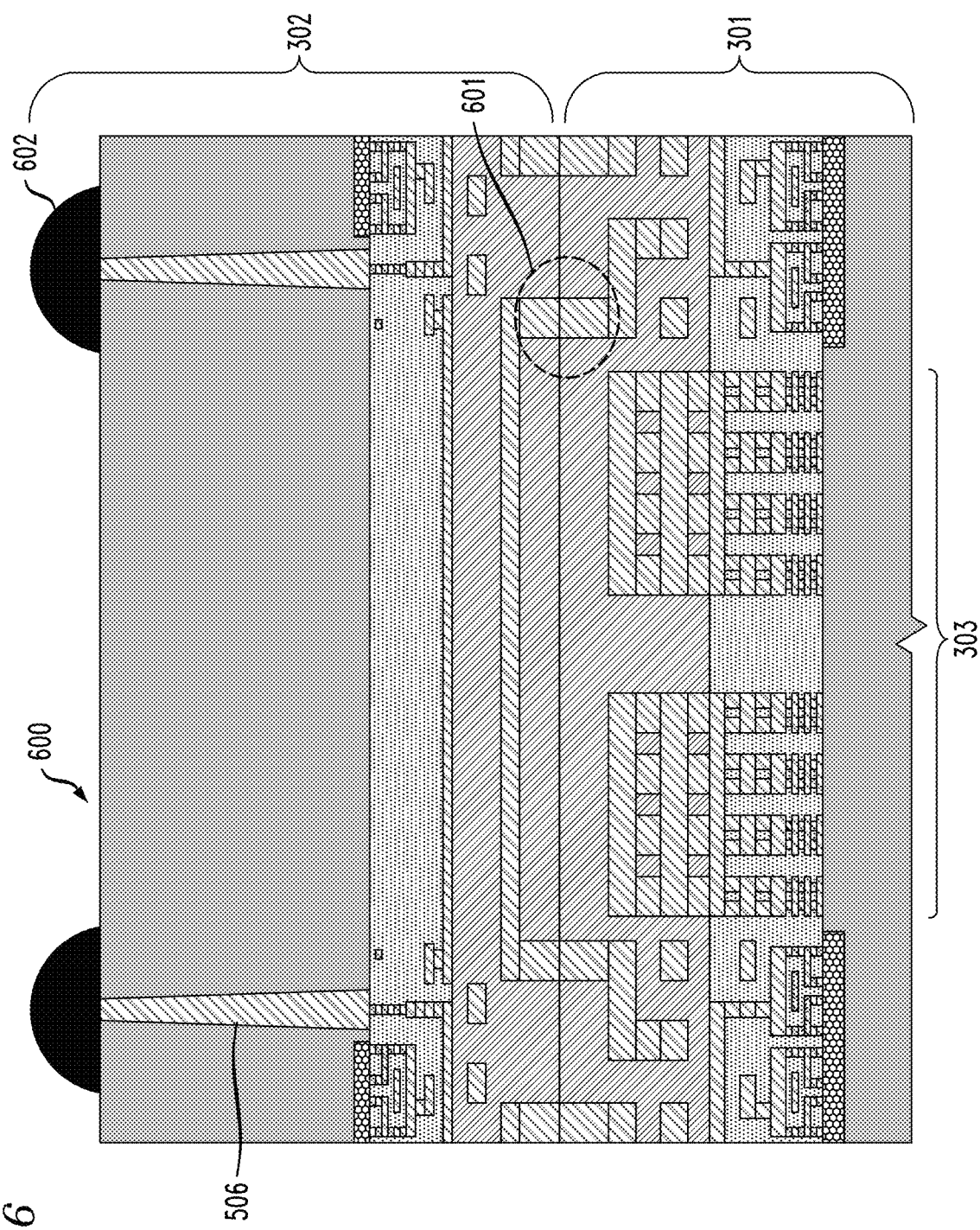
FIG. 6 shows a cross-section of bonded first and second wafers according to one or more embodiments of the present invention.

According to one or more embodiments, the second wafer 302 further comprises chip-to-chip interconnect structures or links 508 in or adjacent to a connection zone 303, which are configured to electrically connect active chip area 402 to active chip area 403 in a bonded device (see 600, FIG. 6). The chip-to-chip interconnect structures 508 facilitate stitched links between adjacent chip sites. According to some embodiments, the chip-to-chip interconnect structures 508 extend to non-adjacent chips (see FIG. 12).

Note that in addition to embodiments where the interconnect structure 508 provides a direct connection between active chip areas 402 and 403 on the first wafer, other embodiments are possible, for example, where active chip areas 402 and 403 on the first wafer connect to corresponding active chip areas 501 and 502 on the second wafer and an indirect connection is formed through them through an interconnect structure 510, which crosses the connection zone 303. According to some embodiments, the interconnect structure 510 connects chip areas 501 and 502, which are both on the second wafer 302 along with the interconnect structure 510. According to some embodiments, these indirect connections can be used in a case where a router is implemented on the second wafer 302 to connect the chip sites on the first wafer 301. According to one or more embodiments, a hybrid connection comprising a mix of interconnect structures 508 and 510, are also contemplated.

According to some embodiments, the second wafer 302 includes router logic, power conversion devices, and decoupling capacitors. According to one or more embodiments, wafer 302 includes TSVs 506, at least one chip-to-chip interconnect structure 508 and/or 510 for chip-to-chip stitching, etc. The chip-to-chip interconnect structures 508 are terminated on a level 503.

Level 503 comprises an insulator 504 (e.g., an oxide insulator) and additional conductive (e.g., Cu) vias 505 in an active chip area enabling wafer-to-wafer bonding.

According to some embodiments, the second wafer 302 comprises a lower-k, dielectric constant, "soft" dielectric 507 and a top "hard" higher-k dielectric 504. The modification of the crack-stop and relocation or removal of the kerf structures from the second wafer 302 allows a connection zone 303 to include wires placed to provide communication between chip sites on the first or second wafers.

According to some embodiments, after wafer-to-wafer bonding, the chip-to-chip interconnect structure 508 in the connection zone 303 provides a link between chip sites.

According to some embodiments, an interconnect wafer 302 is manufactured with modified crack-stops around each die-site, which function as moisture barriers around the perimeter of the active chip areas. According to one or more embodiments, the formation of the wiring between chips (e.g., the chip-to-chip interconnect structures 508 and/or 510) is enabled by moving or eliminating the kerf structures.

Figure 11:
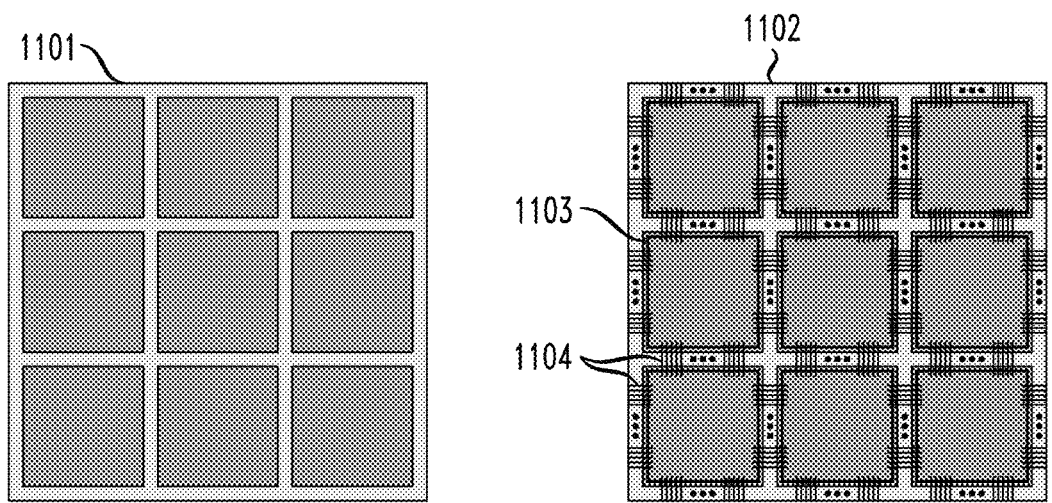
FIG. 11 shows a top-view of a diced/cut sub-sections of the first and second wafers according to one or more embodiments of the present invention.

With a full crack-stop present on a wafer, it may not be possible to form chip-to-chip connections. As mentioned previously, according to some embodiments, a moisture barrier can be formed around the perimeter of the wafer, solely or in unison with a reduced or partial moisture barrier through less than all the layers, e.g., below the chip-to-chip interconnect wiring layers, utilizing the crack-stop around the periphery of each die-site, for those applications in which the wafer is fully utilized and/or is not cut. For other applications requiring cutting of the wafer into one or more sub-sections (e.g., 2×2, 3×3, 4×2, or other derivations, see FIG. 11 showing a sub-section 1101 from the first wafer 301 with kerfs (for example, 204), and sub-section 1102 from the second wafer 302), a modified crack-stop structure, e.g., 1103, around each die-site is also present on the second wafer 302; non-chip-to-chip connection layers preserve a conventional crack-stop, while chip-to-chip connection layers contain any necessary openings of the crack-stop to allow interconnect wiring 1104. In effect, for this type of application, the modified crack-stop structure (e.g., 1201 and 1202 in FIG. 12) contains the necessary porosity in terms of available wiring channels to allow chip-to-chip connections.

Figure 12:
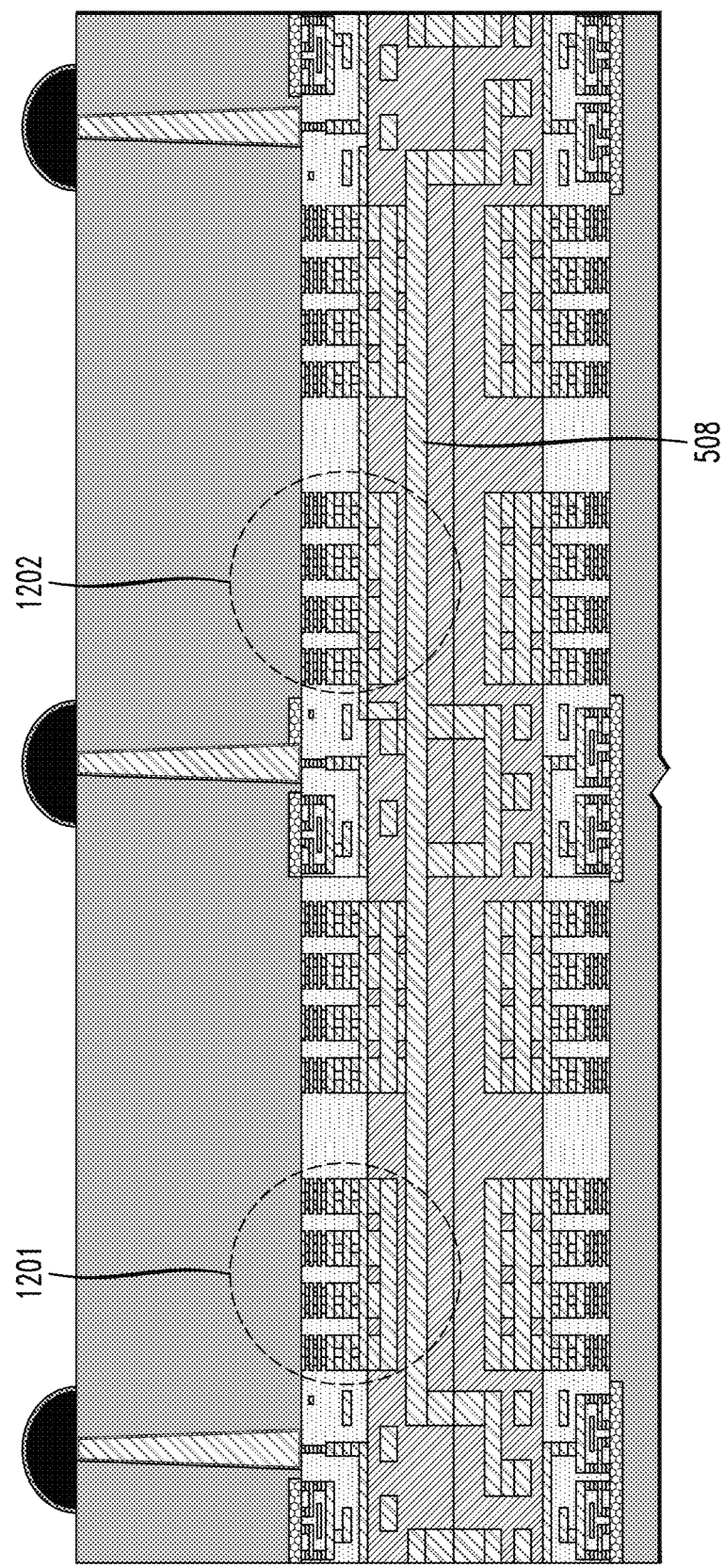
FIG. 12 shows a cross-section of bonded first and seconds wafers with modified crack-stop structures for the first interconnect wafer according to one or more embodiments of the present invention.

It should be appreciated from at least FIGS. 3, 11, and 12 that when the first substrate and the second substrate are bonded together, that the kerfs (for example, 204) of the first substrate 1101 are disposed with correspondence (i.e., in a planar view) around the chip-to-chip interconnects 1104 of the second chips, and further that the crack-stop structures (e.g., 1201 and 1202) of the first substrate are disposed (i.e., in a planar view) within perimeters of the first chips.

It should further be appreciated herein that, unless expressly distinguished, the term crack-stop includes a full, modified crack-stop with openings for chip-to-chip interconnects, or a partial crack-stop disposed in less than all the layers of the substrate.

Referring to FIG. 6 and bonded wafers 301-302, according to some embodiments, the top levels of each wafer are aligned such that interconnects, i.e., the Cu vias (e.g., 406 and 505), of the chips of each wafer contact one another. Further, the wafer-to-wafer interconnects 405 are connected to the chip-to-chip interconnect structure 508 at region 601.

According to some embodiments, C4 (Controlled Collapse Chip Connects) micro solder balls, e.g., 602, are formed on the TSV in second wafer 302. The C4 solder balls can be used to attach laminate wiring substrates to the joined wafer pair. The C4 solder balls 602 are formed onto the wafer pair after they are bonded together, and additional processing can be performed. Note that the C4s are not necessarily formed directly on the TSVs as shown, but maybe connected by an additional wiring level or levels and offset to form a regular array.

According to embodiments of the present invention, chip-to-chip communication is facilitated by the stitched links, e.g., chip-to-chip interconnect structures 508 and connections in region 601, between adjacent chip sites and/or by chip-to-chip interconnect structures 510 and wafer-to-wafer connections between corresponding active chip areas on the first and second wafers. Stitching refers to electrical connections between the chips. It should be understood that intra-chip communication can be built into the wiring of at least the individual chips on both wafers 301 and 302 according to some embodiments of the present invention. In some embodiments, the standard wiring levels of the interconnect wafer are used to provide the chip-to-chip interconnects for the completed structure, where no additional wiring is fabricated to provide the chip-to-chip interconnects.

Figure 7:
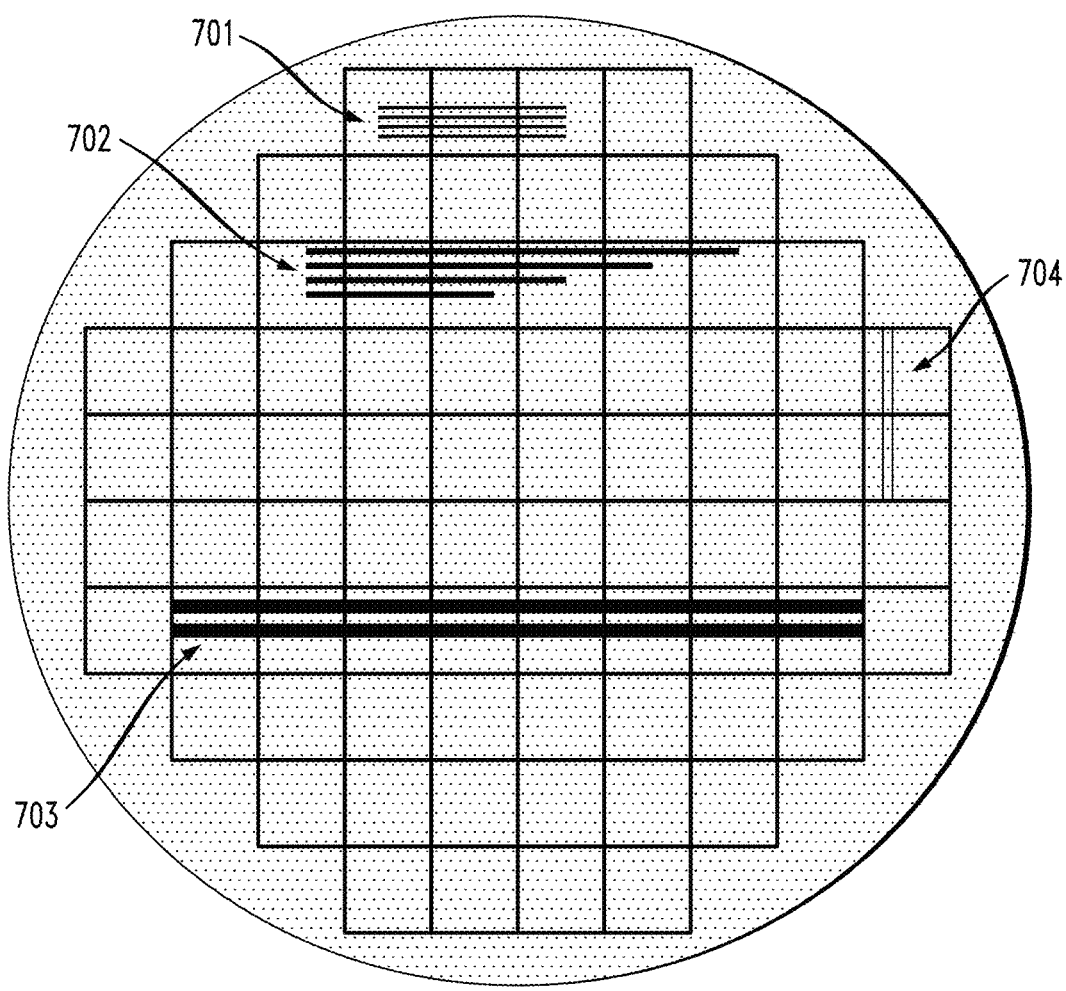
FIG. 7 is a wafer including interconnect structures for non-adjacent chip sites according to one or more embodiments of the present invention.

According to one or more embodiments and referring to FIG. 7, the second wafer 302 further comprises one or more chip-to-chip interconnect structures 701-704 for connecting between non-adjacent die on the first wafer 301. The chip-to-chip interconnect link speed depends upon the interconnect line impedance including the line width, thickness, material conductivity and spacing. For example, a differential copper line pair with a ground reference, wherein each wire has a width of about 0.18 microns at a pitch of about 0.36 microns provides a data rate of about 4 Gbps up to a link distance of 4 millimeters (mm), while a differential copper line with a width of about 5 microns at a pitch of about 10 microns provides a data rate of about 4.5 Gbps at a link distance of up to 120 mm. The final link speed is also dependent on design of the link drivers and receivers. The data rate is dependent on the resistivity of the interconnect lines. In an exemplary case where the interconnect structures are made of a superconducting material, for example, Niobium (Nb) below 9.2 Kelvin (K), with zero resistance the supported data rate would be higher for the same line width, spacing and length.

Figure 8:
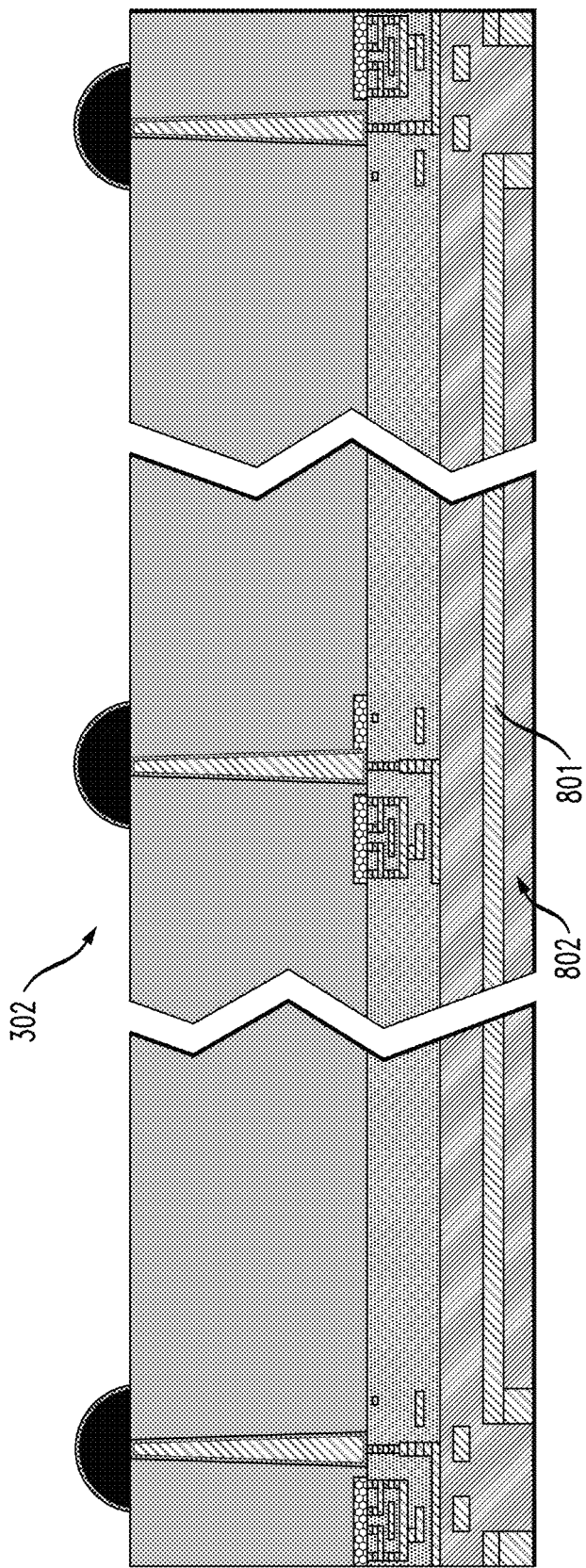
FIG. 8 is a cross-section of the second wafer including a chip-to-chip interconnect integrated into a back-end-of-the-line according to one or more embodiments of the present invention.

According to one embodiment and referring to FIG. 8, a chip-to-chip interconnect 801 is integrated into the back-end-of-the-line (BEOL) wiring levels 802 in the second wafer 302. In BEOL signal wiring levels widths are typically below 0.5 microns.

Figure 9:
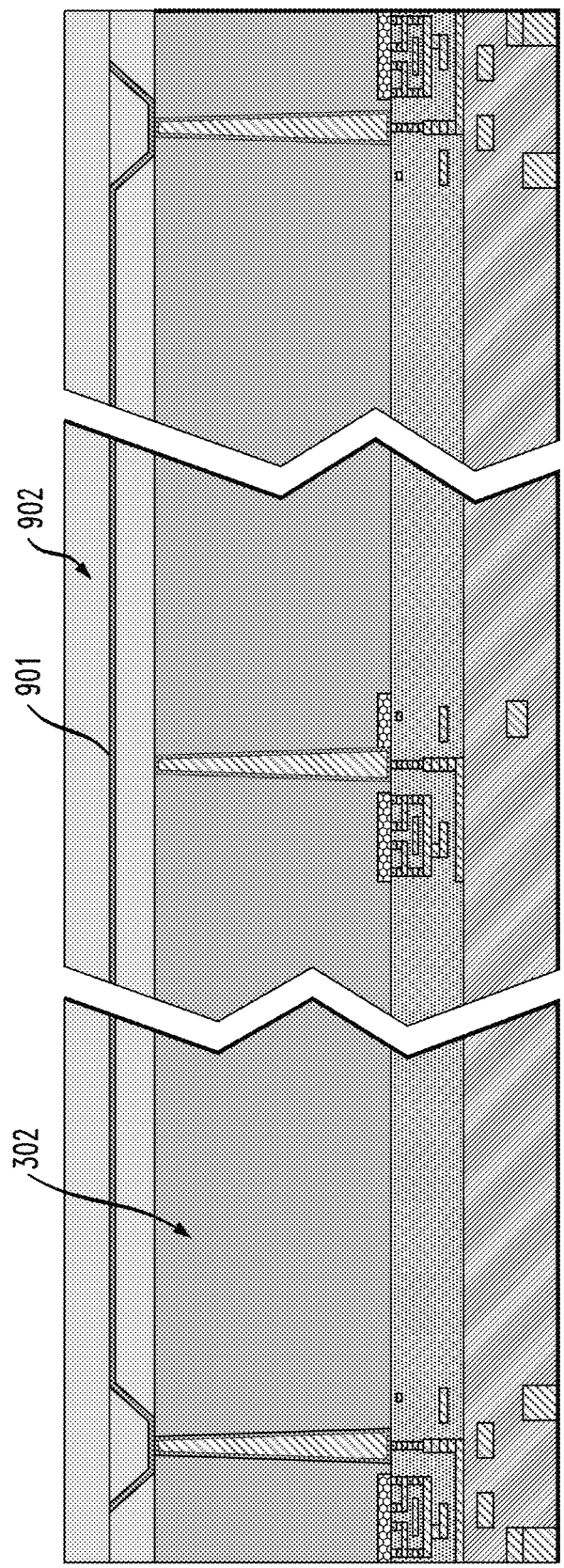
FIG. 9 is a cross-section of the second wafer including a redistribution layer according to one or more embodiments of the present invention.

According to one or more embodiments and referring to FIG. 9, a chip-to-chip interconnect 901 is disposed in an additional redistribution layer 902 on the second wafer 302. According to some embodiments, the redistribution wiring level 902 enables the use of thick and/or wide wires (e.g., that could be disposed in the BEOL, for example, greater than above 5 microns).

According to one or more embodiments, a redistribution wire layer is integrated onto the first wafer 301, second wafer 302, or both wafers 301-302.

Figure 10:
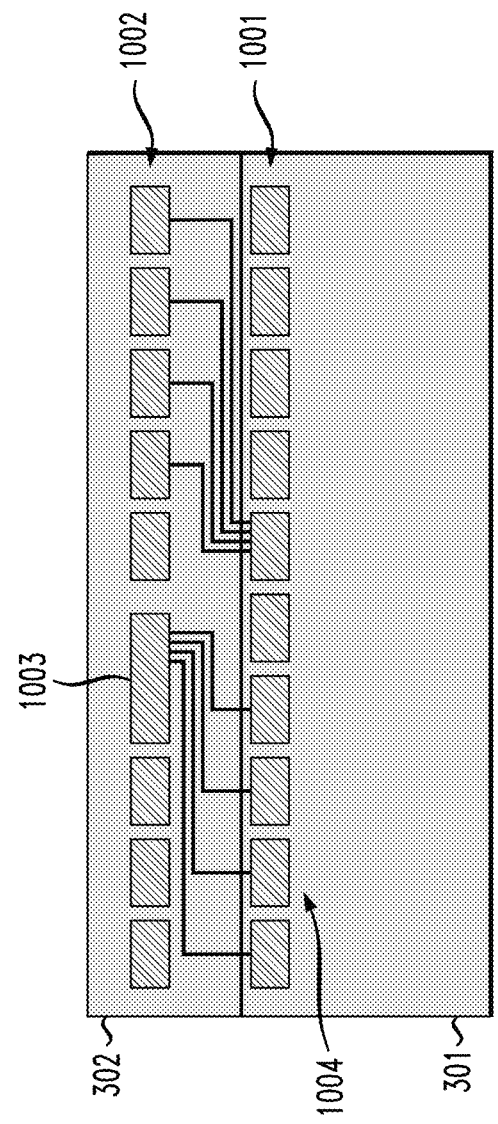
FIG. 10 shows a cross-section of a face-to-face bond between two wafers according to one or more embodiments of the present invention.

According to one or more embodiments and referring to FIG. 10, the chip-to-chip interconnect structures connect one or more chips 1001 on the first wafer 301 to one or more chips 1002 on the second wafer 302. According to some embodiments, the chips on the second wafer 302 do not need to be the same size as chips on the first wafer 301. For example, chip 1003 of the second wafer 302 has a size greater than one or more of chips 1004 of the first wafer 301. According to some embodiments, one or more chips 1004 on the first wafer 301 can be connect to chip 1003 on the second wafer 302. Similarly, one or more chips on the second wafer 302 can be connected to a chip on the first wafer 301.

According to some embodiments the wafers may be joined face-to-face or face-to-back. According to some embodiments, the bonded wafer-scale computer device is a stack of more than two wafers, with adjacent wafers bonded according to techniques described herein, and wherein at least a first wafer is bonded, face-to-face, to a second wafer, and is bonded, back-to-face, to a third wafer, such that the first wafer is disposed between the second and third wafers.

According to some embodiments, the wafer-to-wafer bonding achieves simultaneous oxide/oxide and Cu/Cu connections between the chips of the first and second wafers.

According to some embodiments, the size of the assembly is greater than about 50 mm in at least one dimension. According to some embodiments, the two pieces of silicon are bonded face-to-face where one piece of silicon provides chip-to-chip interconnects for the other piece of silicon.

According to at least one embodiment, to provide power and input/output (I/O) signals to the device 600, an array of mechanically decoupled laminates or ceramic substrates can be attached to the TSV 506. The laminate may be joined to the bonded wafer-scale computing device 600 using indium or alternate low temperature or intermediate temperature solder materials, such either eutectic PbSn or Pb free solders, that also enable low stress solder C4s 602 to allow increased laminate or substrate size and support power delivery and communication requirements. Solder ball attach, land grid array (LGA) or sockets are used to connect a flex, or a printed circuit card to the substrate to provide signals and power, and to maintain mechanical decoupling. Optical links may also be used for high speed data communication links to and from the laminates or substrates attached to the wafer or wafer stack.

According to at least one embodiment, multiple individual laminate wiring substrates (not shown) can be attached to the interconnect wafer 302 and have correspondence to the chip sites on the non-interconnect wafer 301.

Recapitulation:

According to an embodiment of the present invention, a data processing system comprises a first wafer (301) comprising a plurality of first chips (304), and kerf (204) and crack-stop structures (401) around perimeters of the first chips; and a second wafer (302) comprising a plurality second chips (305), a plurality of interconnect structures (508) through a connection zone (303) between the second chips (305), and a plurality of thru silicon vias (506), wherein the first wafer and the second wafer are bonded face-to-face such that the interconnect structures of the second wafer electrically connect (601) adjacent chip sites of the first wafer and where a pitch of the chips on the first and second wafer are equal.

According to an embodiment of the present invention, a computer system includes a first wafer (301) comprising a plurality of wafer-to-wafer interconnect structures (405) terminated on a first insulator surface layer (404) of the first wafer, and a second wafer (302) comprising a plurality of chip-to-chip interconnects (508) disposed through a connection zone (303) and terminated on a second insulator surface layer (504) of the second wafer, and a plurality of thru silicon vias (506), wherein the first wafer and the second wafer are bonded face-to-face such that the chip-to-chip interconnects of the second wafer are electrically connected (601) to the wafer-to-wafer interconnect structures of the first wafer, and the chip-to-chip interconnects and the wafer-to-wafer interconnect structures electrically connect a plurality of chip sites (402-403) and (501-502) of the first wafer and the second wafer, and wherein the first wafer comprises kerf (204) and crack-stop (401) structures around perimeters of the chip sites of the first wafer in the connection zone.

According to an embodiment of the present invention, a data processing system comprising a first substrate (301) comprising a plurality of first chips (304) and comprising a plurality of wafer-to-wafer interconnect structures (405) through a connection zone (303) and terminated on a first insulator surface layer (404), and a second substrate (302) comprising a plurality of second chips (305) and comprising a plurality of chip-to-chip interconnects (508) terminated on a second insulator surface layer (504), and a plurality of thru silicon vias (506), wherein the first substrate and the second substrate are bonded face-to-face such that the chip-to-chip interconnects of the second substrate are electrically connected (601) to the wafer-to-wafer interconnect structures of the first substrate, and the wafer-to-wafer interconnect structures electrically connect opposing ones of the chips of the first and the second substrates, wherein the first substrate comprises kerfs (204) disposed with correspondence around the chip-to-chip interconnects of the seconds chips, wherein the first substrate comprises crack-stop structures (401) disposed within perimeters of the first chips, and wherein the second substrate comprises kerf (204) and crack-stop structures (1201) disposed around the perimeters of the second chips in the connection zone.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A data processing system comprising:
 a first wafer comprising a plurality of first chips, and kerf and crack-stop structures around perimeters of the first chips; and
 a second wafer comprising a plurality second chips, a plurality of interconnect structures through a connection zone between the second chips, and a plurality of thru silicon vias, wherein the first wafer and the second wafer are bonded face-to-face such that the interconnect structures of the second wafer electrically connect adjacent chip sites of the first wafer and where a pitch of the chips on the first and second wafer are equal.

2. The data processing system of claim 1, wherein the second wafer comprises two or more corresponding laminate wiring substrates attached to solder bumps connecting to the thru silicon vias.

3. The data processing system of claim 1, wherein the kerf and crack-stop structures of the first wafer are formed around perimeters of the first chips in the connection zone, and wherein the second wafer does not include individual chip site crack-stop structures.

4. The data processing system of claim 1, wherein the plurality of interconnect structures are terminated on an insulator surface layer of the second wafer.

5. The data processing system of claim 1, wherein adjacent ones of the second chips of the second wafer disposed on different sides of the connection zone electrically connect to corresponding ones of the first chips of the first wafer and an indirect electrical connection is formed between adjacent ones of the first chips of the first wafer through the plurality of interconnect structures, and wherein the second chips of the second wafer are electrically connected by the plurality of interconnect structures.

6. The data processing system of claim 1, wherein the second wafer is an interconnect wafer comprising at least one of a router logic, a power conversion device, a memory device, and a decoupling capacitor.

7. A computer system comprising:
a first wafer comprising a plurality of wafer-to-wafer interconnect structures terminated on a first insulator surface layer of the first wafer; and
a second wafer comprising a plurality of chip-to-chip interconnects disposed through a connection zone and terminated on a second insulator surface layer of the second wafer, and a plurality of thru silicon vias,
wherein the first wafer and the second wafer are bonded face-to-face such that the chip-to-chip interconnects of the second wafer are electrically connected to the wafer-to-wafer interconnect structures of the first wafer, and the chip-to-chip interconnects and the wafer-to-wafer interconnect structures electrically connect a plurality of chip sites of the first wafer and the second wafer, and
wherein the first wafer comprises kerf and crack-stop structures around perimeters of the chip sites of the first wafer in the connection zone.

8. The computer system of claim 7, where the chip-to-chip interconnects of the second wafer electrically connect at least an adjacent pair of the chip sites of the first wafer.

9. The computer system of claim 7, where the chip-to-chip interconnects of the second wafer electrically connect at least a non-adjacent pair of the chip sites of the first wafer.

10. The computer system of claim 7, where the chip-to-chip interconnects and the wafer-to-wafer interconnect structures electrically connect at least one of the chips of the first wafer to at least one of the chips on the second wafer.

11. The computer system of claim 7, further comprising a redistribution layer formed on at least one of a surface of the second wafer opposite the first wafer and a surface of the first wafer opposite the second wafer.

12. The computer system of claim 7, further comprising a power supply electrically connected to at least one of the thru silicon vias, providing power to the first and the second wafers.

13. The computer system of claim 7, wherein data input/output is communicated through at least one of the thru silicon vias.

14. The computer system of claim 7, wherein a plurality of individual laminate wiring substrates are attached to the second wafer and having correspondence to the chip sites of the first wafer.

15. The computer system of claim 7, wherein the chip-to-chip interconnects are arranged around a perimeter of chip sites of the second wafer.

16. The computer system of claim 7, the face-to-face bonding achieves a simultaneous oxide-to-oxide and copper-to-copper connections between the chip sites of the first and second wafers, wherein the chip-to-chip interconnects and the wafer-to-wafer interconnect structures are formed of copper.

17. The computer system of claim 7, wherein the second wafer does not include crack-stop structures and where a pitch of the chip sites on the first and second wafers are equal.

18. A data processing system comprising:
a first substrate comprising a plurality of first chips and comprising a plurality of wafer-to-wafer interconnect structures through a connection zone and terminated on a first insulator surface layer; and
a second substrate comprising a plurality of second chips and comprising a plurality of chip-to-chip interconnects terminated on a second insulator surface layer, and a plurality of thru silicon vias,
wherein the first substrate and the second substrate are bonded face-to-face such that the chip-to-chip interconnects of the second substrate are electrically connected to the wafer-to-wafer interconnect structures of the first substrate, and the wafer-to-wafer interconnect structures electrically connect opposing ones of the chips of the first and the second substrates,
wherein the first substrate comprises kerfs disposed with correspondence around the chip-to-chip interconnects of the seconds chips,
wherein the first substrate comprises crack-stop structures disposed within perimeters of the first chips, and
wherein the second substrate comprises kerf and crack-stop structures disposed around the perimeters of the second chips in the connection zone.

19. The data processing system of claim 18, wherein the first substrate and the second substrate are substantially the same size and a pitch of the chips on the two substrates are equal.

20. The data processing system of claim 18, wherein the first substrate further comprises crack-stop structures adjacent to the chip-to-chip interconnects.

* * * * *